United States Patent
Foong et al.

(10) Patent No.: US 10,446,965 B2
(45) Date of Patent: Oct. 15, 2019

(54) SPRING CONTACT IN A TESTING APPARATUS FOR INTEGRATED CIRCUITS

(71) Applicant: JF MICROTECHNOLOGY SDN. BHD., Petaling Jaya, Selangor (MY)

(72) Inventors: Wei Kuong Foong, Petaling Jaya (MY); Kok Sing Goh, Petaling Jaya (MY); Shamal Mundiyath, Petaling Jaya (MY); Eng Kiat Lee, Petaling Jaya (MY)

(73) Assignee: JF MICROTECHNOLOGY SDN. BHD., Petaling Jaya (MY)

(*) Notice: Subject to any disclaimer, the term of this patent is extended or adjusted under 35 U.S.C. 154(b) by 411 days.

(21) Appl. No.: 15/438,508

(22) Filed: Feb. 21, 2017

(65) Prior Publication Data

US 2017/0244189 A1    Aug. 24, 2017

(30) Foreign Application Priority Data

Feb. 22, 2016  (MY) .............................. 2016000319

(51) Int. Cl.
*G01R 1/067* (2006.01)
*H01R 13/24* (2006.01)

(52) U.S. Cl.
CPC ..... *H01R 13/2428* (2013.01); *G01R 1/06722* (2013.01); *H01R 2201/20* (2013.01)

(58) Field of Classification Search
CPC ...... G01R 31/28; G01R 31/2886; G01R 1/06; G01R 1/067; G01R 1/06716; G01R 1/06722; G01R 1/06733; G01R 1/06738; G01R 1/0675; H01R 13/24; H01R 13/2428; H01R 13/187; H01R 4/247; H01R 4/52; H01R 4/48; H01R 4/4809; H01R 4/4854

See application file for complete search history.

(56) References Cited

U.S. PATENT DOCUMENTS

| | | | | |
|---|---|---|---|---|
| 4,773,877 A | * | 9/1988 | Kruger | G01R 1/06722 324/755.05 |
| 2002/0142669 A1 | * | 10/2002 | Phillips | H01R 13/2428 439/700 |
| 2004/0121627 A1 | * | 6/2004 | Grube | G01R 1/06733 439/66 |

* cited by examiner

*Primary Examiner* — Son T Le
(74) *Attorney, Agent, or Firm* — Maschoff Brennan

(57) ABSTRACT

A vertical spring contact is constructed of a single piece of electrical conductor, having a central spine that acts as a spring and does not bulge horizontally during compression. This contact is also provided with a pair of arms extending downwards from a top member, flanking both sides of the central spine without being in contact with the central spine. The lower tips of the arms are bent inwards. The central spine structurally connects the top member to a bottom member. The bottom member is provided with recesses that are adapted to loosely receive the lower tips of the arms. In this way, when the contact is compressed, the lower tips of the arms are pressed into the recesses, thus establishing more contact points for a current to pass through.

5 Claims, 3 Drawing Sheets

US 10,446,965 B2

SPRING CONTACT IN A TESTING APPARATUS FOR INTEGRATED CIRCUITS

FIELD OF INVENTION

The present invention relates to an electrical contact in an integrated circuit testing apparatus.

BACKGROUND OF INVENTION

There are currently various different types of electrical contacts used as test probes in integrated circuit (IC) device testing. Among these, vertical type contacts have several advantages, such as allowing for better signal integrity and shorter current path between the device terminal and the load board terminal. One sub-type of vertical contacts, known as a vertical spring contact, typically comprises of 3 or 4 individual components, with one of the components being spring mounted axially to the direction of compression, hence the name vertical spring contact. This type of contact with its multiple components suffers from interference and friction losses, across the components, which results in compromised signal integrity.

A further sub-type of vertical spring contacts are those that have a 2-D planar design. In these, the spring is usually a strip of material that has been bent or formed in a zig-zag or other repetitive configuration in order to form a spring, as opposed to a 3-D design which tends to use circular springs. The springs in the 2-D design types tend to bulge out horizontally when compressed. This may cause friction and wear on any surfaces that may come into contact with the bulging material.

What is needed in the art is a vertical spring contact that overcomes the above disadvantages.

SUMMARY OF INVENTION

The present invention seeks to overcome the aforementioned disadvantages by providing a vertical spring contact that is constructed of a single piece of electrical conductor, having a central spine that acts as a spring and does not bulge horizontally during compression. This contact is also provided with a pair of arms extending downwards from a top member, flanking both sides of the central spine without being in contact with the central spine. The lower tips of the arms are bent inwards. The central spine structurally connects the top member to a bottom member. The bottom member is provided with recesses that are adapted to loosely receive the lower tips of the arms. In this way, when the contact is compressed, the lower tips of the arms are pressed into the recesses, thus establishing more contact points for a current to pass through.

This invention thus relates to an electrical contact for use in an integrated circuit testing apparatus, comprising: a vertical central spine formed of a sequence of upwardly curved members, each being connected to the other said upwardly curved members in a substantially zig-zag configuration, thus forming a spring-like member. A rigid top member having a first arm and a second arm extend downwards from each side of the rigid top member, thus substantially enveloping the vertical central spine on opposing sides thereof. An upper end of said vertical central spine is connected to the rigid top member between where the first and second arms extend. A rigid bottom member is connected to a lower end of the vertical central spine. The bottom member is provided with a first recess and a second recess, each being adapted to loosely receive a first tip of the first arm and a second tip of the second arm, respectively. Thus, the central spine joins the top and bottom members. Hence, while it is acts as a spring in the vertical direction, it also provides some structural support for the entire contact. Due to the shape of the curved members, and the way they are joined together, the central spine compresses in a vertical direction without bulging in a horizontal direction. This allows the contact to be compressed without stressing the arms mechanically.

The curved members are designed to provide the central spine with a progressive spring rate. This is done by varying the curve pitch progressively, with each curved member.

The first and second arms do not contact the central spine in either a compressed or an uncompressed state.

The first tip and second tip do not contact walls of the first recess and second recess, respectively, in an uncompressed state, and contact the walls of the first recess and the second recess, respectively, in a pre-loaded state.

In a preferred embodiment, the first tip and the second tip are bent inwards, towards the direction of the central spine, and the corresponding first recess and second recess, respectively, are also sloped inwards to accommodate for the first tip and the second tip being bent. When the contact is compressed during testing, outer surfaces of each tip are pressed into wall surfaces of the recesses. This tapered design reverses back to the initial position when the contact is uncompressed. This results in a very strong contact between the arms and the walls of the recesses, which results in a better overall electrical contact.

The entire electrical contact is constructed from a single piece of electrically conductive material.

Other objects and advantages will be more fully apparent from the following disclosure and appended claims.

DETAILED DESCRIPTION OF INVENTION

Figure 1A:
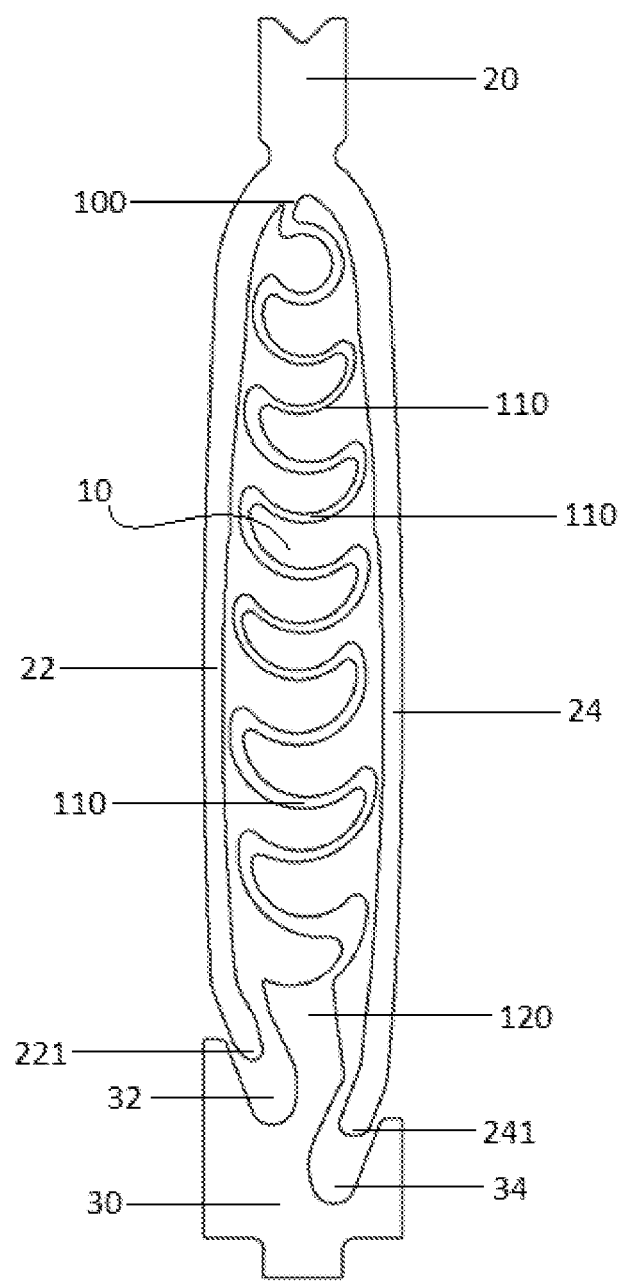
FIG. 1a shows a view of a contact in an uncompressed state in embodiment of this invention.

It should be noted that the following detailed description is directed to a spring contact of an integrated circuit (IC) testing apparatus, and is not limited to any particular size or configuration but in fact a multitude of sizes and configurations within the general scope of the following description.

LIST OF NUMBERED ELEMENTS IN FIGURES

Central spine (10)
Upper end of central spine (100)
Curved horizontal members (110)
Lower end of central spine (120)
Top member (20)
First arm (22)
First tip (221)
Second arm (24)
Second tip (241)
Bottom member (30)
First recess (32)
Second recess (34)

Figure 1B:
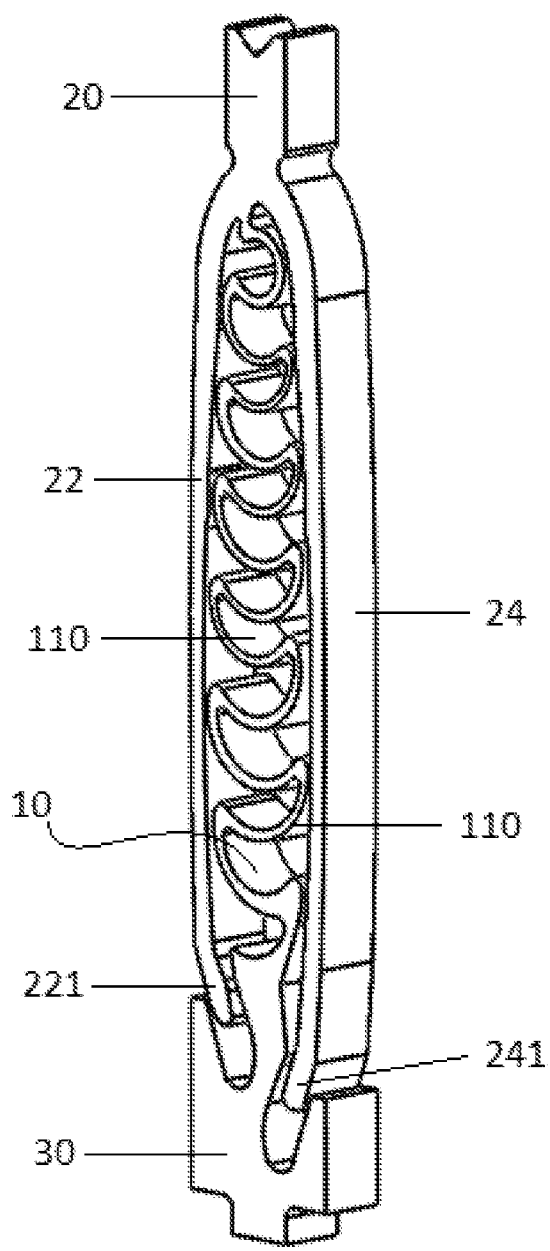
FIG. 1b shows an isometric view of a contact in an embodiment of this invention.

Referring to FIGS. 1a and 1b, there are shown views of an electrical contact for use in an integrated circuit testing apparatus. A vertical central spine (10) is formed of a sequence of upwardly curved members (110), with the curved members connected to each other in a substantially zig-zag configuration, and resembling bellows. This allows this central spine (10) to be compressed in the axial or vertical direction. The design of each curved member (110) and the way they join each other allow for it to be compressed in the vertical direction without having any bulging in the horizontal direction. The individual curved members (110) also have progressively larger sizes from top to bottom, making the overall shape of the central spine (10) conical or flaring downwards.

A rigid top member (20) having a first arm (22) and a second arm (24) extending downwards from opposing sides of the top member (20), thus substantially enveloping the central spine (10) on opposing sides. An upper end (100) of said central spine (10) is connected to the top member (20) in between where the first (22) and second arms (24) extend downwards. A bottom member (30) is connected to a lower end (120) of the central spine (10). This said bottom member (30) is provided with a first recess (32) and a second recess (34), each said recess adapted to loosely receive a first tip (221) of said first arm (22) and second tip (241) of said second arm (24), respectively. The said central spine (10) is designed such that it compresses in a vertical direction without any bulging in a horizontal direction.

Still referring to FIGS. 1a and 1b, the said first (22) and second (24) arms are never in contact with said central spine (10) in either a compressed or uncompressed state. The said first tip (221) and second tip (241) are not in contact with the said first recess (32) and second recess (34), respectively in an uncompressed state, and establish contact with the said first recess (32) and second recess (34), respectively, in a compressed state. The said first tip (221) and second tip (241) are bent inwards, and the corresponding first recess (32) and second recess (34) are also sloped inwards to accommodate for this bending. The entire electrical contact is constructed from a single piece of electrically conductive material.

Figure 2:
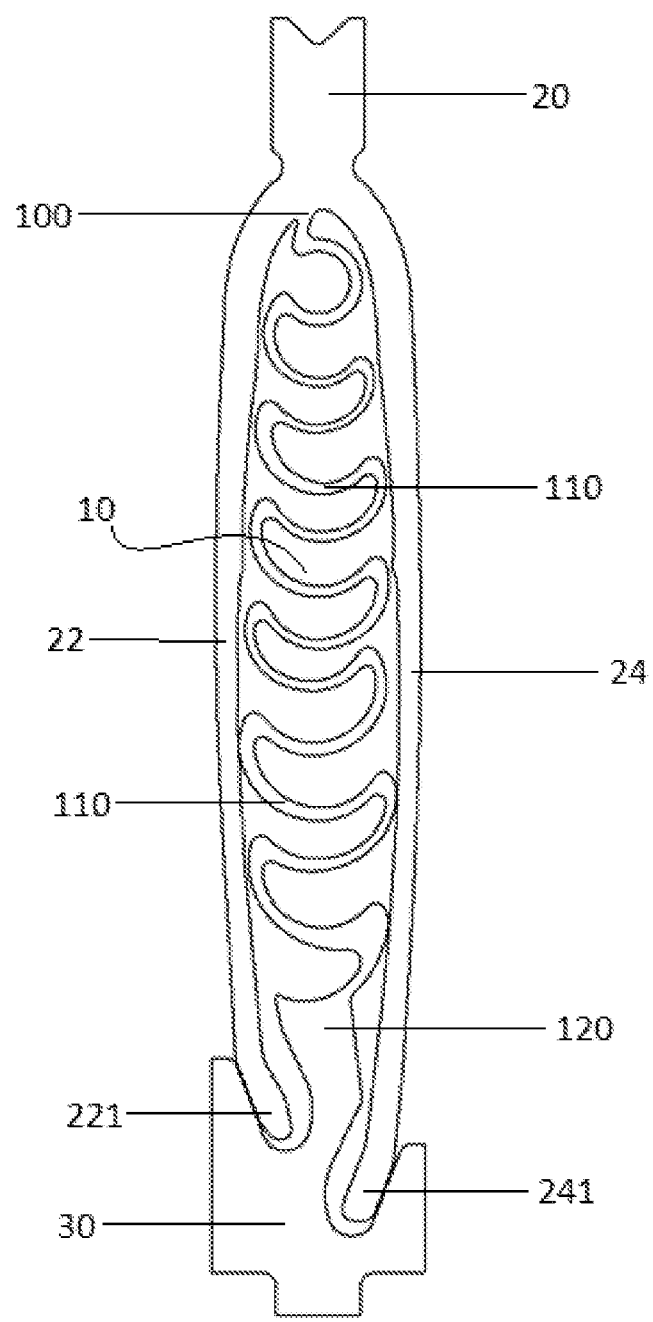
FIG. 2 shows a view of a contact in a compressed state in an embodiment of this invention.

Referring to FIG. 2, there is shown the same contact in a pre-loaded state. There is shown a vertical central spine (10) formed of a sequence of upwardly curved members (110), with the curved members connected to each other in a substantially zig-zag configuration, and resembling bellows. A rigid top member (20) having a first arm (22) and a second arm (24) extending downwards from opposing sides of the top member (20), thus substantially enveloping the central spine (10) on opposing sides. An upper end (100) of said central spine (10) is connected to the top member (20) in between where the first (22) and second arms (24) extend downwards. A bottom member (30) is connected to a lower end (120) of the central spine (10). This said bottom member (30) is provided with a first recess (32) and a second recess (34), each said recess adapted to loosely receive a first tip (221) of said first arm (22) and second tip (241) of said second arm (24), respectively. The said first tip (221) and second tip (241) are bent inwards, and the corresponding first recess (32) and second recess (34) are also sloped inwards to accommodate for this bending. In this compressed state, it is clearly seen that as the contact is compressed, outer surfaces of each tip (221, 241) are pressed into wall surfaces of the recesses (32, 34). This tapered design reverses back to the initial position when the contact is uncompressed. This results in a very strong contact between the arms (22, 24) and the walls of the recesses (32, 34), which results in a better overall electrical contact.

While several particularly preferred embodiments of the present invention have been described and illustrated, it should now be apparent to those skilled in the art that various changes and modifications can be made without departing from the spirit and scope of the invention. Accordingly, the following claims are intended to embrace such changes, modifications, and areas of application that are within the scope of this invention.

The invention claimed is:

1. An electrical contact for use in an integrated circuit testing apparatus, comprising:
    a vertical central spine formed of a sequence of upwardly curved members, each being connected to the other said upwardly curved members in a substantially zig-zag configuration;
    a rigid top member having a first arm and a second arm extending downwards from each side of the rigid top member, thus substantially enveloping the vertical central spine on opposing sides thereof, an upper end of said vertical central spine being connected to the rigid top member between where the first and second arms extend; and
    a bottom member connected to a lower end of said vertical central spine, said bottom member being provided with a first recess and a second recess, each being adapted to loosely receive a first tip of said first arm and a second tip of said second arm, respectively, wherein:
    the vertical central spine is configured to compress in a vertical direction without bulging in a horizontal direction.

2. An electrical contact for use in an integrated circuit testing apparatus in accordance with claim 1, wherein said first and second arms do not contact said vertical central spine in either a compressed state or an uncompressed state.

3. An electrical contact for use in an integrated circuit testing apparatus in accordance with claim 1, wherein said first tip and second tip do not contact said first recess and said second recess, respectively, in an uncompressed state, and contact said first recess and said second recess, respectively, in a compressed state.

4. An electrical contact for use in an integrated circuit testing apparatus in accordance with claim 1, wherein said first tip and said second tip are bent inwards, and the corresponding first recess and second recess, respectively, are also sloped inwards to accommodate said first tip and said second tip being bent.

5. An electrical contact for use in an integrated circuit testing apparatus in accordance with claim 1, wherein the entire electrical contact is constructed from a single piece of electrically conductive material.

\* \* \* \* \*